United States Patent
Song

(10) Patent No.: US 8,471,239 B2
(45) Date of Patent: Jun. 25, 2013

(54) LIGHT-EMITTING ELEMENT AND A PRODUCTION METHOD THEREFOR

(75) Inventor: June O Song, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 0 days.

(21) Appl. No.: 12/989,200

(22) PCT Filed: Apr. 23, 2009

(86) PCT No.: PCT/KR2009/002142
§ 371 (c)(1),
(2), (4) Date: Dec. 30, 2010

(87) PCT Pub. No.: WO2009/131401
PCT Pub. Date: Oct. 29, 2009

(65) Prior Publication Data
US 2011/0108798 A1 May 12, 2011

(30) Foreign Application Priority Data

Apr. 25, 2008 (KR) .................. 10-2008-0038586
Apr. 27, 2008 (KR) .................. 10-2008-0039083

(51) Int. Cl.
*H01L 29/06* (2006.01)
(52) U.S. Cl.
USPC ............ 257/13; 257/79; 257/94; 257/95; 257/98; 257/E33.005
(58) Field of Classification Search
None
See application file for complete search history.

(56) References Cited

U.S. PATENT DOCUMENTS

| 6,121,636 A | 9/2000 | Morita et al. | |
| 6,657,236 B1* | 12/2003 | Thibeault et al. | 257/98 |
| 7,968,361 B2 | 6/2011 | Osawa et al. | |
| 2001/0035532 A1* | 11/2001 | Ito et al. | 257/103 |
| 2004/0119084 A1* | 6/2004 | Hsieh et al. | 257/98 |
| 2004/0149996 A1 | 8/2004 | Hsieh et al. | 257/88 |
| 2005/0062049 A1* | 3/2005 | Lin et al. | 257/79 |
| 2005/0077528 A1 | 4/2005 | Liu et al. | 257/79 |
| 2005/0199888 A1 | 9/2005 | Seong et al. | 257/79 |
| 2005/0205875 A1* | 9/2005 | Shei et al. | 257/79 |
| 2005/0236636 A1* | 10/2005 | Hon et al. | 257/99 |
| 2006/0054898 A1 | 3/2006 | Lai et al. | |

(Continued)

FOREIGN PATENT DOCUMENTS

JP 2007-273659 10/2007
KR 10-2007-0063912 A 6/2007

(Continued)

OTHER PUBLICATIONS

European Search Report dated Nov. 2, 2011 issued in Application No. 09 7304490.

(Continued)

*Primary Examiner* — Benjamin Sandvik
*Assistant Examiner* — Leslie Pilar Cruz
(74) *Attorney, Agent, or Firm* — KED & Associates, LLP

(57) ABSTRACT

Disclosed is a light emitting device. The light emitting device includes a support substrate; a planar layer over the support substrate; a wafer bonding layer over the planar layer; a current spreading layer over the wafer bonding layer; a second conductive semiconductor layer over the current spreading layer; an active layer over the second conductive semiconductor layer; a first conductive semiconductor layer over the active layer; a first electrode layer over the first conductive semiconductor layer; and a second electrode layer over the current spreading layer.

12 Claims, 10 Drawing Sheets

U.S. PATENT DOCUMENTS

| | | | |
|---|---|---|---|
| 2007/0221944 A1 | 9/2007 | Yoo | 257/99 |
| 2008/0042153 A1* | 2/2008 | Beeson et al. | 257/94 |
| 2008/0067916 A1 | 3/2008 | Hsu et al. | |
| 2008/0217635 A1* | 9/2008 | Emerson et al. | 257/98 |
| 2008/0258174 A1 | 10/2008 | Seong | 257/184 |

FOREIGN PATENT DOCUMENTS

| | | |
|---|---|---|
| KR | 10-0728132 B1 | 6/2007 |
| KR | 10-2007-0081482 A | 8/2007 |
| WO | WO 2007/121735 A2 | 11/2007 |
| WO | WO 2008/040289 A2 | 4/2008 |

OTHER PUBLICATIONS

Chinese Office Acted dated Dec. 23, 2011 issued in Application No. 200980114626.2 (English translation only).

PCT International Search Report dated Dec. 14, 2009 issued in Application No. PCT/KR2009/002142.

European Office Action for Application 09 734 490.7 dated Jul. 18, 2012.

* cited by examiner

LIGHT-EMITTING ELEMENT AND A PRODUCTION METHOD THEREFOR

TECHNICAL FIELD

The embodiment relates to a light emitting device and a method of manufacturing the same.

BACKGROUND ART

Recently, a light emitting diode (LED) is spotlighted as a light emitting device. Since the LED can convert electric energy into light energy with high efficiency and long life span of about 5 years or more, the LED can remarkably reduce the energy consumption and repair and maintenance cost. In this regard, the LED is spotlighted in the next-generation lighting field.

Such an LED is prepared as a light emitting semiconductor layer including a first conductive semiconductor layer, an active layer and a second conductive semiconductor layer, in which the active layer generates light according to current applied thereto through the first and second conductive semiconductor layers.

Meanwhile, since the second conductive semiconductor layer has relatively high sheet resistance due to low carrier concentration and mobility, the LED requires a current spreading layer including ITO (indium tin oxide) or ZnO (zinc oxide) to form an ohmic contact interface with respect to the second conductive semiconductor layer.

In order to allow light generated from the active layer to be emitted to the outside as much as possible, the light extraction efficiency of the LED must be improved. In this regard, research and studies have been performed to form a light extracting structure having a concavo-convex pattern on the second conductive semiconductor layer. However, when the concavo-convex pattern is formed on the second conductive semiconductor layer, electric characteristics of the LED may be degraded.

DISCLOSURE

Technical Problem

The embodiment provides a light emitting device having a novel structure and a method of manufacturing the same.

The embodiment provides a light emitting device having improved electrical characteristics and a method of manufacturing the same.

The embodiment provides a light emitting device having improved light efficiency and a method of manufacturing the same.

Technical Solution

A light emitting device according to the embodiment may include a support substrate; a planar layer over the support substrate; a wafer bonding layer over the planar layer; a current spreading layer over the wafer bonding layer; a second conductive semiconductor layer over the current spreading layer; an active layer over the second conductive semiconductor layer; a first conductive semiconductor layer over the active layer; a first electrode layer over the first conductive semiconductor layer; and a second electrode layer over the current spreading layer.

A light emitting device according to the embodiment may include a support substrate; a metal thick film layer over the support substrate; a wafer bonding layer over the metal thick film layer; a current spreading layer over the wafer bonding layer; a second conductive semiconductor layer over the current spreading layer; an active layer over the second conductive semiconductor layer; a first conductive semiconductor layer over the active layer; a first electrode layer over the first conductive semiconductor layer; and a second electrode layer over the current spreading layer.

Advantageous Effects

The embodiment can provide a light emitting device having a novel structure and a method of manufacturing the same.

The embodiment can provide a light emitting device having improved electrical characteristics and a method of manufacturing the same.

The embodiment can provide a light emitting device having improved light efficiency and a method of manufacturing the same.

BEST MODE

Mode for Invention

Figure 1:
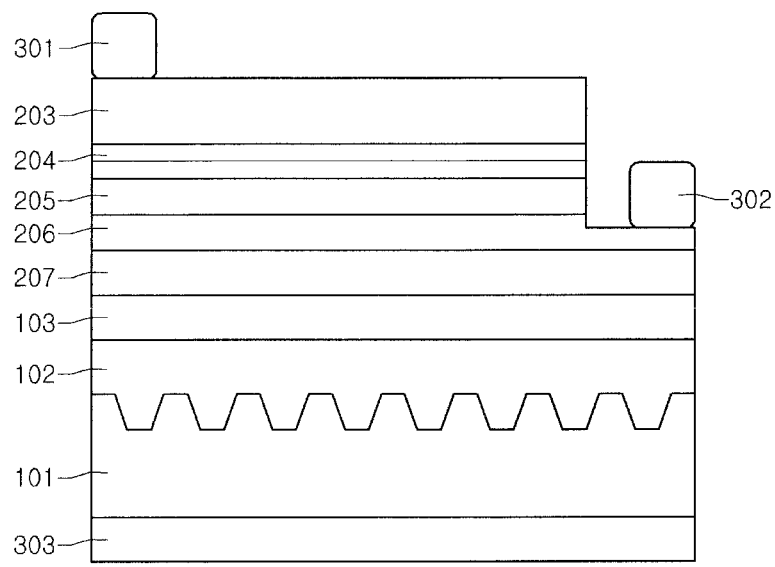
FIG. 1 is a sectional view showing the structure of a light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

FIG. 1 is a sectional view showing the structure of a light emitting device according to the first embodiment.

Referring to FIG. 1, a support substrate 101 is formed on a reflective layer 303, and a planar layer 102 is formed on the support substrate 101.

In addition, a first wafer bonding layer 103 and a second wafer bonding layer 207 are formed on the planar layer 102, and a current spreading layer 206 is formed on the second wafer bonding layer 207.

A light emitting semiconductor layer including a second conductive semiconductor layer 205, an active layer 204, and a first conductive semiconductor layer 203 is formed on the current spreading layer 206.

Meanwhile, a first electrode layer 301 is formed on the second conductive semiconductor layer 205, and the current spreading layer 206 and the light emitting semiconductor layer are selectively etched, so that a part of the current spreading layer 206 exposed to the outside and a second electrode 302 is formed on the exposed part of the current spreading layer 206.

In more detail, the reflective layer is formed on a bottom surface of the support substrate 101 to reflect the light emitted from the active layer 204 in the upward direction, thereby improving the light extraction efficiency. For instance, the reflective layer 303 may include a material having reflectivity of about 70% or above with respect to the light having the wavelength of about 600 nm or below. In detail, the reflective layer 303 may include at least one selected from the group consisting of Al, Ag, Rh, Cr, Ni and Au.

A concavo-convex structure is formed on the top surface of the support substrate 101. The concavo-convex structure can be formed through the wet etching process or the dry etching process. For instance, the support substrate 101 may include one of AlN, GaN, epitaxial sapphire, polycrystalline sapphire, and SiC. The concavo-convex structure of the support substrate 101 may improve the light extraction efficiency of the light emitting device.

The planar layer 102 is formed on the top surface of the support substrate 101. For instance, the planar layer 102 can be formed by growing a transparent material using MOCVD, HVPE or MBE equipment, or by depositing a transparent material using a sputter, an evaporator, a PLD or a spin-coater. The planar layer 102 may include one of GaN, AlGaN, ZnO, $SiO_2$, $SiN_x$, SOG, and $Al_2O_3$.

The planar layer 102 is formed on a bottom surface thereof with a concavo-convex structure corresponding to the concavo-convex structure of the support substrate 101 and the top surface of the planar layer 102 is planarized.

The first and second wafer bonding layers 103 and 207 provide stable mechanical bonding force between the planar layer 102 and the current spreading layer 206. For instance, the first and second wafer bonding layers 103 and 207 may include a transparent material capable of improving the light efficiency, such as $SiO_2$, $SiN_x$, $Al_2O_3$, ZnO, ZnS, $MgF_2$, or SOG (spin on glass).

The current spreading layer 206 may include a transparent material and form an ohmic contact interface with respect to the second conductive semiconductor layer 205.

For instance, the current spreading layer 206 may include one of Ni—Au—O, ITO, and ZnO having the transmittance of about 70% or above with respect to the light having the wavelength of 600 nm or below.

The current spreading layer 206 can be formed through the physical vapor deposition (PVD) or the chemical vapor deposition (CVD).

The current can be effectively injected into the active layer 204 due to the current spreading layer 206, so that the operational voltage of the light emitting device can be lowered and the current leakage is prevented. As a result, the electric characteristics of the light emitting device can be improved.

The light emitting semiconductor layer including the first conductive semiconductor layer 203, the active layer 204, and the second conductive semiconductor layer 205 can be formed by using group III nitride-based semiconductor materials. The first conductive semiconductor layer 203 may include a GaN layer including n type impurities, such as Si, and the second conductive semiconductor layer 205 may include a GaN layer including p type impurities, such as Mg or Zn.

The active layer 204 emits light through the recombination of electrons and holes. For instance, the active layer 204 may include one of InGaN, AlGaN, GaN, and AlInGaN. The active layer 204 can be coated with Si or Mg. In addition, the wavelength of light emitted from the light emitting device may be determined depending on the intrinsic material of the active layer 204.

The active layer 204 may include a multiple layer where well layers and barrier layers are repeatedly formed. An energy bandgap of the intrinsic material for the barrier layer is greater than the energy bandgap of the intrinsic material for the well layer, and the barrier layer is thicker than well layer.

Meanwhile, although not shown in the drawings, a superlattice structure layer can be formed between the current spreading layer 206 and the second conductive semiconductor layer 205.

The superlattice structure layer forms an ohmic contact interface with respect to the second conductive semiconductor layer 205 such that the current can be easily injected in the vertical direction. In addition, the superlattice structure layer may increase the effective hole concentration by reducing dopant activation energy of the second conducive semiconductor layer 205, or may cause a quantum mechanical tunneling conduction through energy bandgap engineering.

The superlattice structure layer can be prepared as a multi-layer structure including nitride or carbon nitride containing group II, III or IV elements. Each layer of the superlattice structure layer may be formed at a thickness of about 5 nm or below. Each layer of the superlattice structure layer may include at least one selected from the group consisting of InN, InGaN, InAlN, AlGaN, GaN, AlInGaN, AlN, SiC, SiCN, MgN, ZnN, and SiN, and may be doped with Si, Mg, or Zn. For example, the superlattice structure layer may be prepared as a multi-layer structure, such as InGaN/GaN, AlGaN/GaN, InGaN/GaN/AlGaN, or AlGaN/GaN/InGaN.

The superlattice structure layer may be prepared as a single layer structure. For example, the superlattice structure layer may include an InGaN layer, a GaN layer, an AlInN layer, an AlN layer, an InN layer, an AlGaN layer, an AlInGaN layer, an SiC layer, an SiCN layer, an MgN layer, or a ZnN layer doped with n type impurities. In addition, the superlattice structure layer may include an InGaN layer, a GaN layer, an AlInN layer, an AlN layer, an InN layer, an AlGaN layer or an AlInGaN layer doped with p type impurities.

The first electrode layer 301 is formed on the first conductive semiconductor layer 203 by using a material having reflectance of about 50% or above with respect to the light having the wavelength of 600 nm or below. For instance, the first electrode layer 301 may include at least one selected from the group consisting of Al, Ag, Rh, Ti, Cr, V, Nb, TiN, Cu, Ta, Au, Pt, Pd, Ru and metallic silicide.

The second electrode layer 302 is formed on the current spreading layer 206 while forming an ohmic contact interface with respect to the current spreading layer 206. For instance, the second electrode layer 302 is prepared as a stack structure, such as Pt/Au.

Figure 2:
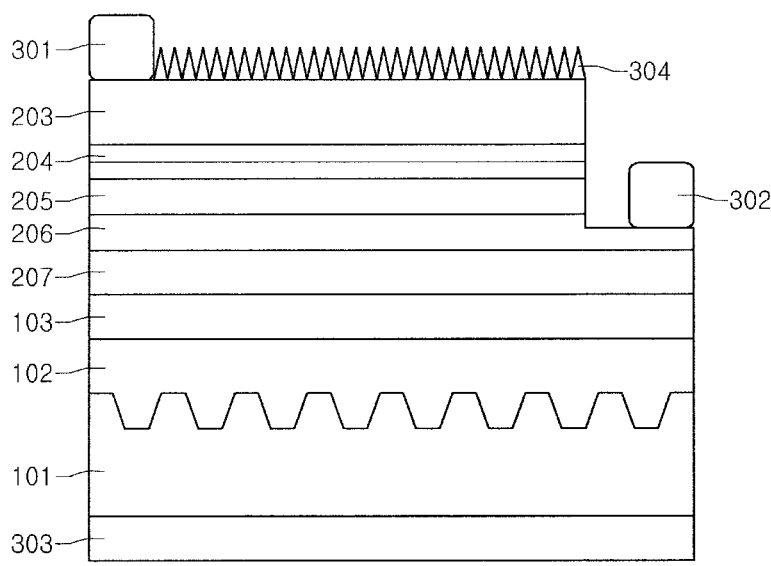
FIG. 2 is a sectional view showing the structure of a light emitting device according to the second embodiment.

FIG. 2 is a sectional view showing the structure of a light emitting device according to the second embodiment.

The light emitting device according to the second embodiment is similar to the light emitting device according to the first embodiment. Thus, details of the elements or structures that have been described in the first embodiment will be omitted in order to avoid redundancy.

Referring to FIG. 2, the light emitting device according to the second embodiment includes a light extracting structure layer 304 formed on the first conductive semiconductor layer 203.

The light extracting structure layer 304 has a concavo-convex structure on the first conductive semiconductor layer 203 in order to allow the light generated from the active layer 204 to be effectively emitted to the outside. The light extracting structure layer 304 can be formed by selectively etching the first conductive semiconductor layer 203. Otherwise, an additional material is formed on the first conductive semiconductor layer 203 and then the first conductive semiconductor layer 203 is etched to form the light extracting structure layer 304.

The light emitted from the active layer 204 can be easily extracted through the first conductive semiconductor layer 203 by the light extraction structure layer 304, so that the light efficiency of the light emitting device can be improved.

Figure 3:
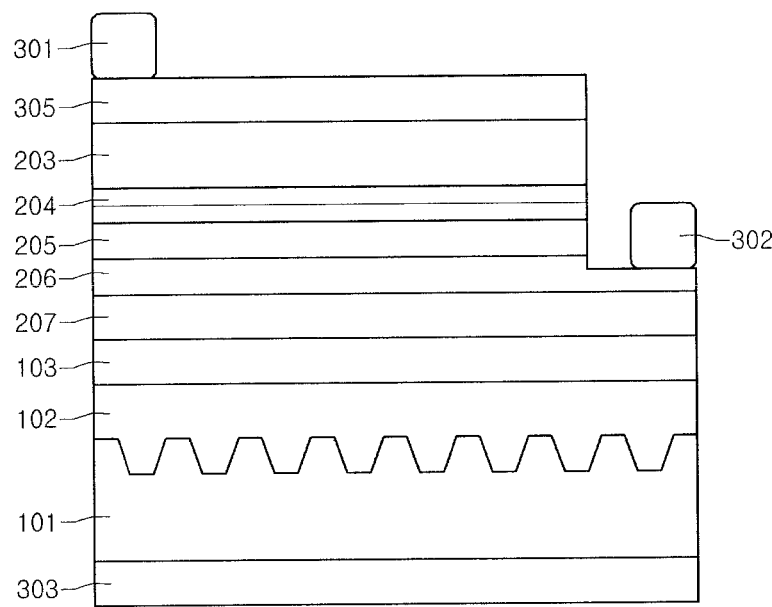
FIG. 3 is a sectional view showing the structure of a light emitting device according to the third embodiment.

FIG. 3 is a sectional view showing the structure of a light emitting device according to the third embodiment.

The light emitting device according to the third embodiment is similar to the light emitting device according to the first embodiment. Thus, details of the elements or structures that have been described in the first embodiment will be omitted in order to avoid redundancy.

Referring to FIG. 3, an ohmic contact electrode layer 305 is formed on the first conductive semiconductor layer 203, and the first electrode layer 301 is formed on the ohmic contact electrode layer 305.

The ohmic contact electrode layer 305 forms an ohmic contact interface with respect to the first conductive semiconductor layer 203 and includes a material having transmittance of about 70% or above with respect to the light having the wavelength of about 600 nm or below.

For instance, the ohmic contact electrode layer 305 includes at least one selected from the group consisting of TiN, TiO, ITO, ZnO, $RuO_2$, $IrO_2$, $In_2O_3$, $SnO_2$, ZnGaO, InZnO, ZnInO, and Ni—O—Au.

The current can be effectively injected into the active layer 204 due to the ohmic contact electrode layer 305, so that the electric characteristics of the light emitting device can be improved.

Figure 4:
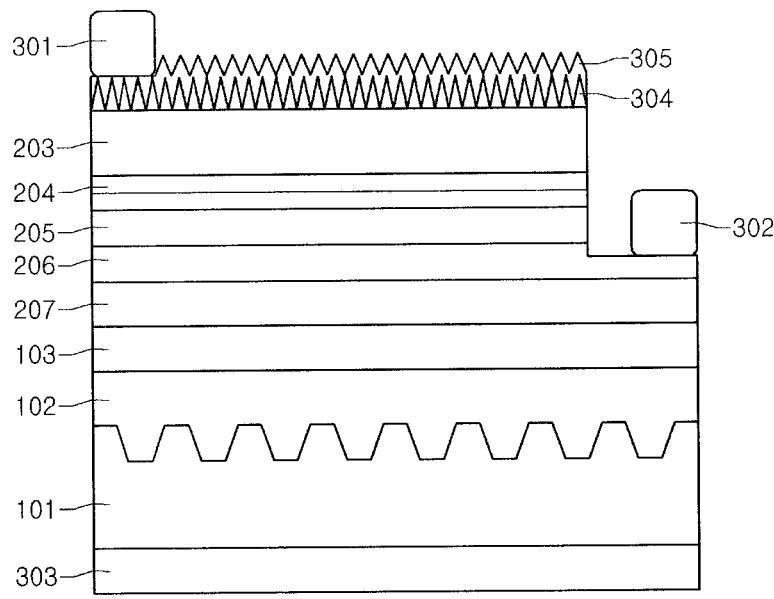
FIG. 4 is a sectional view showing the structure of a light emitting device according to the fourth embodiment.

FIG. 4 is a sectional view showing the structure of a light emitting device according to the fourth embodiment.

The light emitting device according to the fourth embodiment is similar to the light emitting device according to the first embodiment. Thus, details of the elements or structures that have been described in the first embodiment will be omitted in order to avoid redundancy.

Referring to FIG. 4, the light emitting device according to the fourth embodiment includes a light extracting structure layer 304 formed on the first conductive semiconductor layer 203 and an ohmic contact electrode layer 305 formed on the light extracting structure layer 304. In addition, the first electrode 301 is formed on the ohmic contact electrode layer 305.

The light extracting structure layer 304 has a concavo-convex structure on the first conductive semiconductor layer 203 in order to allow the light generated from the active layer 204 to be effectively emitted to the outside. The light extracting structure layer 304 can be formed by selectively etching the first conductive semiconductor layer 203. Otherwise, an additional material is formed on the first conductive semiconductor layer 203 and then the first conductive semiconductor layer 203 is etched to form the light extracting structure layer 304.

The light emitted from the active layer 204 can be easily extracted through the first conductive semiconductor layer 203 by the light extraction structure layer 304, so that the light efficiency of the light emitting device can be improved.

The ohmic contact electrode layer 305 includes a material having transmittance of about 70% or above with respect to the light having the wavelength of about 600 nm or below.

For instance, the ohmic contact electrode layer 305 includes at least one selected from the group consisting of TiN, TiO, ITO, ZnO, $RuO_2$, $IrO_2$, $In_2O_3$, $SnO_2$, ZnGaO, InZnO, ZnInO, and Ni—O—AU.

The current can be effectively injected into the active layer 204 due to the ohmic contact electrode layer 305, so that the electric characteristics of the light emitting device can be improved.

FIGS. 5 to 11 are sectional views showing the procedure for manufacturing the light emitting device according to the first embodiment.

Figure 5:
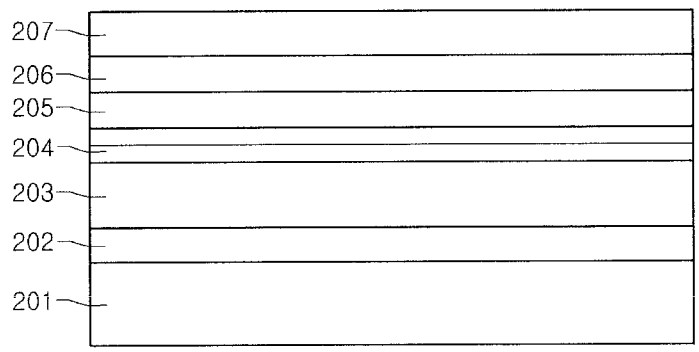
FIGS. 5 to 11 are sectional views showing the procedure for manufacturing a light emitting device according to the first embodiment.

Referring to FIG. 5, a buffer layer 202 is formed on a growth substrate 201, a light emitting semiconductor layer including the first conductive semiconductor layer 203, the active layer 204 and the second conductive semiconductor layer 205 is formed on the buffer layer 202, and the current spreading layer 206 and the second wafer bonding layer 207 are formed on the second conductive semiconductor layer 205.

For instance, the growth substrate 201 may include $Al_2O_3$, SiC, Si, AlN, GaN, AlGaN, glass, or GaAs.

The buffer layer 202 is formed on the growth substrate 201 for the lattice match and includes at least one selected from the group consisting of InGaN, AlN, SiC, SiCN, and GaN.

The light emitting semiconductor layer can be formed on the buffer layer through the MOCVD process or the MBE process. For example, the first conductive semiconductor layer 203 may include a GaN layer or an AlGaN layer doped with Si, and the active layer 204 may include an undoped InGaN layer or an undoped GaN layer. In addition, the second conductive semiconductor layer 205 may include a GaN layer or an AlGaN layer doped with Mg.

Figure 6:
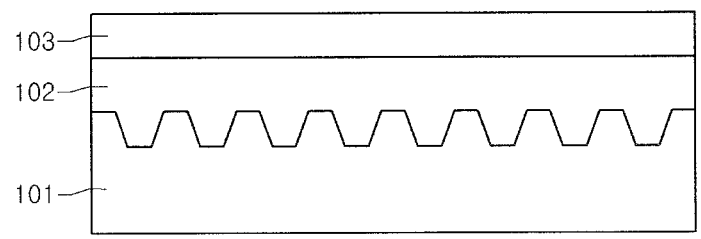

Referring to FIG. 6, the support substrate 101 is prepared and the planar layer 102 and the first wafer bonding layer 103 are formed on the support substrate 101.

First, the concavo-convex structure is formed on the support substrate 101 and the planar layer 102 is grown or deposited on the support 101 substrate having the concavo-convex structure. The support substrate 101 may include a material having a thermal expansion coefficient identical or similar to that of the growth substrate 201.

In addition, the first wafer bonding layer 103 is formed on the planar layer 102.

The first wafer bonding layer 103 may include a material identical to or different from a material of the second wafer bonding layer 207.

Figure 7:
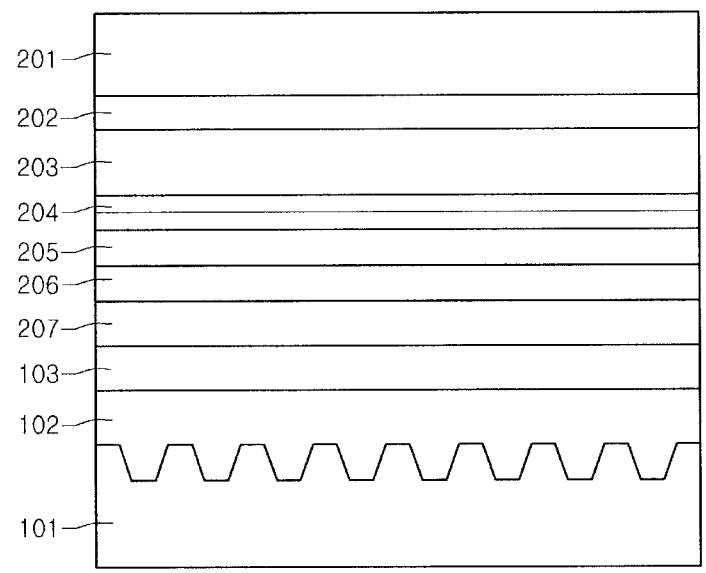

Referring to FIG. 7, the structure shown in FIG. 5 is combined with the structure shown in FIG. 6 through the bonding process, thereby forming a complex structure.

That is, the complex structure is formed by combining the first wafer bonding layer 103 and the second wafer bonding layer 207.

The wafer bonding process can be performed under the vacuum, oxygen, argon or nitrogen atmosphere at the temperature range from the normal temperature to 700° C. or below while applying predetermined hydrostatic pressure. At this time, the interface property between the second conductive semiconductor layer 205 and the current spreading layer 206 must not be degraded.

Figure 8:
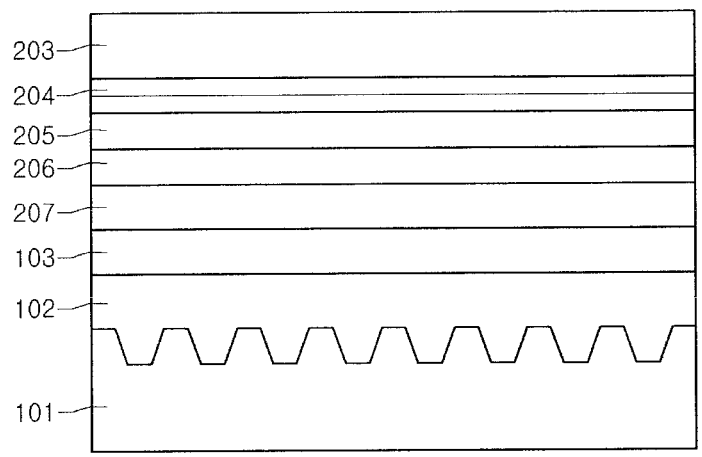

Referring to FIG. 8, the growth substrate 201 is separated from the complex structure shown in FIG. 7. The growth substrate 201 can be separated from the complex structure through the thermo-chemical decomposing reaction or the chemical etching reaction.

For instance, if a transparent substrate subject to the thermo-chemical decomposition reaction, such as a sapphire substrate or an AlN substrate, is used for the growth substrate 201, the growth substrate 201 can be separated from the complex structure by irradiating photon beams onto the growth substrate 201.

At this time, the buffer layer 202 is also removed from the first conductive semiconductor layer 203.

Figure 9:
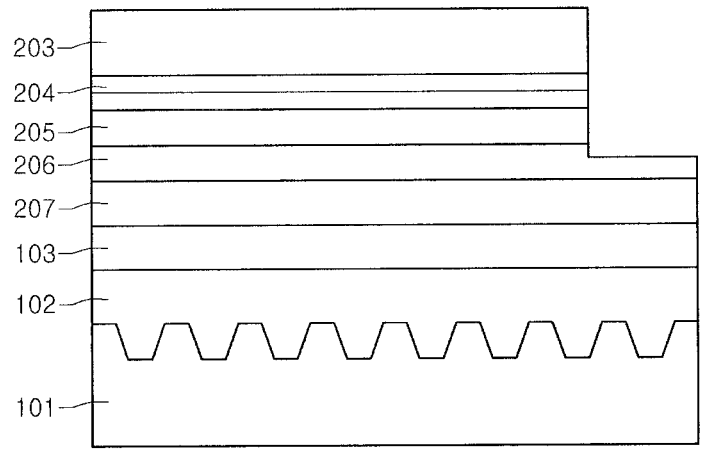

Referring to FIG. 9, the first conductive semiconductor layer 203, the active layer 204, the second conductive semiconductor layer 205, and the current spreading layer 206 are selectively removed through the dry etching or the wet etching process in such a manner that the current spreading layer 206 is partially exposed to the outside. When the wet etching process is performed, a base such as KOH, a salt or an acid solution can be employed.

Figure 10:
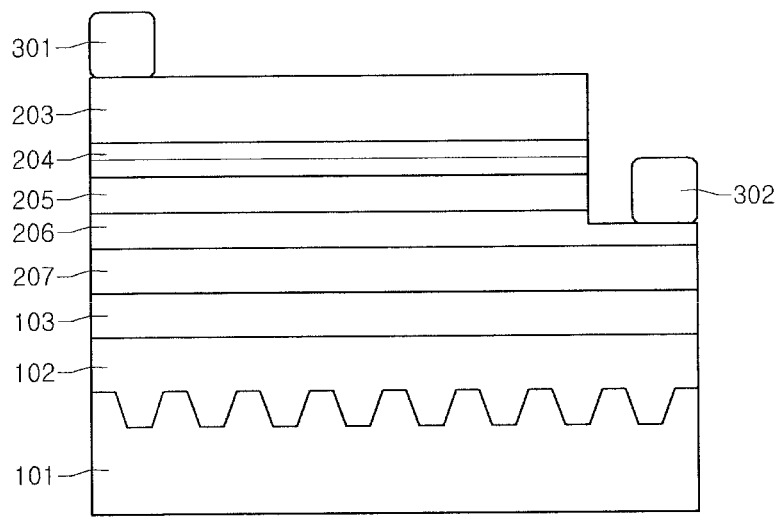

Referring to FIG. 10, the first electrode layer 301 is formed on the first conductive semiconductor layer 203 and the second electrode layer 302 is formed on the current spreading layer 206.

Figure 11:
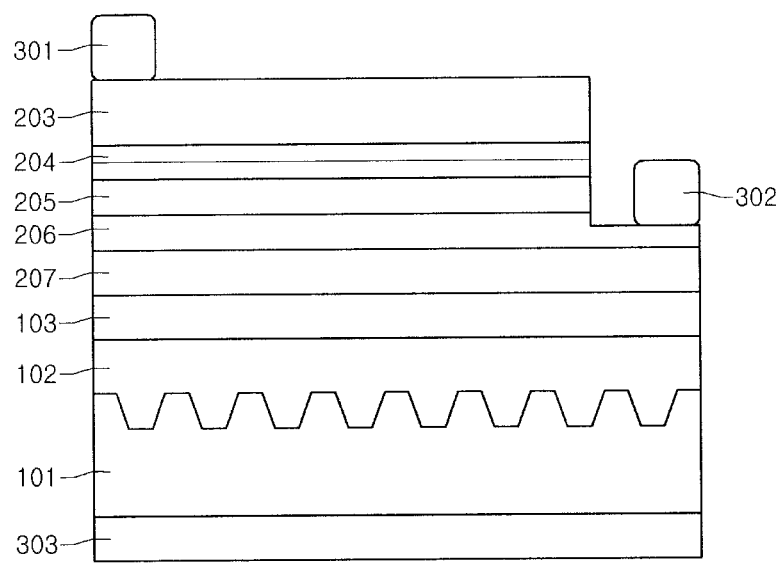

Referring to FIG. 11, the reflective layer 303 is formed under the support substrate 101.

The light emitting device according to the first embodiment can be manufactured through the above procedure.

Meanwhile, the method of manufacturing the light emitting device according to the second embodiment is similar to that of the first embodiment.

According to the second embodiment, after the process shown in FIG. 9 has been performed, the light extracting structure 304 is formed by dry etching or wet etching the first conductive semiconductor layer 203 before the first electrode layer 301 is formed.

In addition, the method of manufacturing the light emitting device according to the third embodiment is similar to that of the first embodiment.

According to the third embodiment, after the process shown in FIG. 9 has been performed, the ohmic contact electrode layer 305 is formed on the first conductive semiconductor layer 203 before the first electrode layer 301 is formed.

Further, the method of manufacturing the light emitting device according to the fourth embodiment is similar to that of the first embodiment.

According to the fourth embodiment, after the process shown in FIG. 9 has been performed, the light extracting structure 304 is formed by dry etching or wet etching the first conductive semiconductor layer 203 and the ohmic contact electrode layer 305 is formed on the light extracting structure 304 before the first electrode layer 301 is formed.

Figure 12:
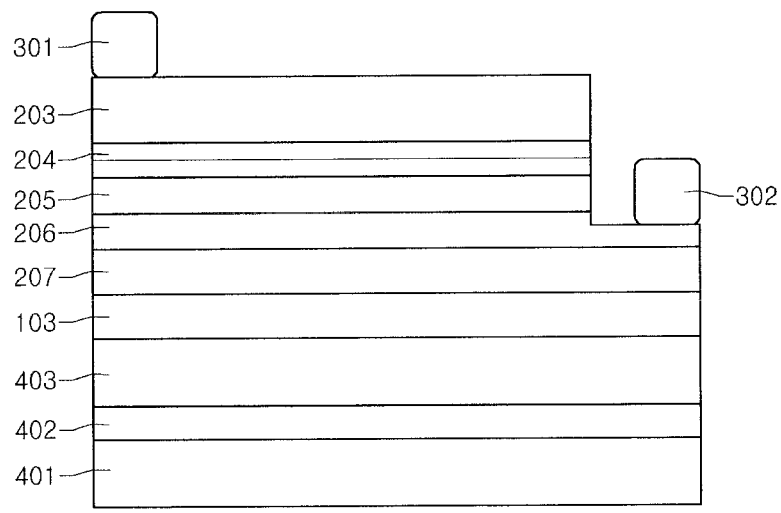
FIG. 12 is a sectional view showing the structure of a light emitting device according to the fifth embodiment.

FIG. 12 is a sectional view showing the structure of a light emitting device according to the fifth embodiment.

Referring to FIG. 5, a bonding reinforcing layer 402 is formed on a support substrate 401, and a metal thick film layer 403 is formed on the bonding reinforcing layer 402.

In addition, the first and second wafer bonding layers 103 and 207 are formed on the metal thick film layer 403, and the current spreading layer 206 is formed on the second wafer bonding layer 207.

The light emitting semiconductor layer including the second conductive semiconductor layer 205, the active layer 204 and the first conductive semiconductor layer 203 is formed on the current spreading layer 206.

Meanwhile, the first electrode layer 301 is formed on the first conductive semiconductor layer 203, and the current spreading layer 206 and the light emitting semiconductor layer are selectively etched in such a manner that the current spreading layer 206 can be partially exposed to the outside. Thus, the second electrode layer 302 is formed on the exposed part of the current spreading layer 206.

In more detail, the support substrate 401 includes a material identical to a material for the growth substrate (not shown) used for growing the light emitting semiconductor layer. For instance, the support substrate 401 may include one of AlN, GaN, epitaxial sapphire, polycrystalline sapphire, and SiC.

The bonding reinforcing layer 402 reinforces the bonding force between the support substrate 401 and the metal thick film layer 403. The bonding reinforcing layer 402 serves as a seed layer to form the metal thick film layer 403 through the electroplating process. The bonding reinforcing layer 402 includes a metal or an alloy.

The metal thick film layer 403 can easily dissipate heat generated from the light emitting semiconductor layer to the outside. The metal thick film layer 403 can be formed through the electroplating process, the sputtering process or the deposition process by using a metal or an alloy having a thickness of about 5 μm or above. For instance, the metal thick film layer 403 may include at least one selected from the group consisting of Cu, Ag, Au, Ni, Ti, Nb, W, Cr, NiCr and CuW.

The first and second wafer bonding layers 103 and 207 provide stable mechanical bonding force between the metal thick film layer 403 and the current spreading layer 206. For instance, the first and second wafer bonding layers 103 and 207 may include at least one selected from the group consisting of Al, Ag, Cu, Pt, Pd and Au.

The current spreading layer 206 includes a material having high reflectivity and forms an ohmic contact interface with respect to the second conductive semiconductor layer 205.

For instance, the current spreading layer 206 includes one of oxidized Al, Ag and Rh having the reflectance of about 70% or above with respect to the light having the wavelength of about 600 nm or below.

The current spreading layer 206 can be formed through the physical vapor deposition (PVD) or the chemical vapor deposition (CVD).

The current can be effectively injected into the active layer 204 due to the current spreading layer 206, so that the operational voltage of the light emitting device can be lowered and the current leakage is prevented. As a result, the electric characteristics of the light emitting device can be improved.

The light emitting semiconductor layer including the first conductive semiconductor layer 203, the active layer 204, and the second conductive semiconductor layer 205 can be formed by using group III nitride-based semiconductor materials. The first conductive semiconductor layer 203 may include a GaN layer including n type impurities, such as Si, and the second conductive semiconductor layer 205 may include a GaN layer including p type impurities, such as Mg or Zn.

The active layer 204 emits light through the recombination of electrons and holes. For instance, the active layer 204 may include one of InGaN, AlGaN, GaN, and AlInGaN. The active layer 204 can be coated with Si or Mg. In addition, the wavelength of light emitted from the light emitting device may be determined depending on the intrinsic material of the active layer 204.

The active layer 204 may include a multiple layer where well layers and barrier layers are repeatedly formed. An energy bandgap of the intrinsic material for the barrier layer is greater than the energy bandgap of the intrinsic material for the well layer, and the barrier layer is thicker than well layer.

Meanwhile, although not shown in the drawings, a superlattice structure layer can be formed between the current spreading layer 206 and the second conductive semiconductor layer 205.

The superlattice structure layer forms an ohmic contact interface with respect to the second conductive semiconductor layer 205 such that the current can be easily injected in the vertical direction. In addition, the superlattice structure layer may increase the effective hole concentration by reducing dopant activation energy of the second conducive semiconductor layer 205, or may cause a quantum mechanical tunneling conduction through energy bandgap engineering.

The superlattice structure layer can be prepared as a multi-layer structure including nitride or carbon nitride containing group II, III or IV elements. Each layer of the superlattice structure layer may be formed at a thickness of about 5 nm or below. Each layer of the superlattice structure layer may include at least one selected from the group consisting of InN, InGaN, in AlN, AlGaN, GaN, AlInGaN, AlN, SiC, SiCN, MgN, ZnN, and SiN, and may be doped with Si, Mg, or Zn. For example, the superlattice structure layer may be prepared as a multi-layer structure, such as InGaN/GaN, AlGaN/GaN, InGaN/GaN/AlGaN, or AlGaN/GaN/InGaN.

The superlattice structure layer may be prepared as a single layer structure. For example, the superlattice structure layer may include an InGaN layer, a GaN layer, an AlInN layer, an AlN layer, an InN layer, an AlGaN layer, an AlInGaN layer, an SiC layer, an SiCN layer, an MgN layer, or a ZnN layer doped with n type impurities. In addition, the superlattice structure layer may include an InGaN layer, a GaN layer, an AlInN layer, an AlN layer, an InN layer, an AlGaN layer or an AlInGaN layer doped with p type impurities.

The first electrode layer 301 is formed on the first conductive semiconductor layer 203 by using a material having reflectance of about 50% or above with respect to the light having the wavelength of 600 nm or below. For instance, the first electrode layer 301 may include at least one selected from the group consisting of Al, Ag, Rh, Ti, Cr, V, Nb, TiN, Cu, Ta, Au, Pt, Pd, Ru and metallic silicide.

The second electrode layer 302 is formed on the current spreading layer 206 while forming an ohmic contact interface with respect to the current spreading layer 206. For instance, the second electrode layer 302 is prepared as a stack structure, such as Pt/Au.

Figure 13:
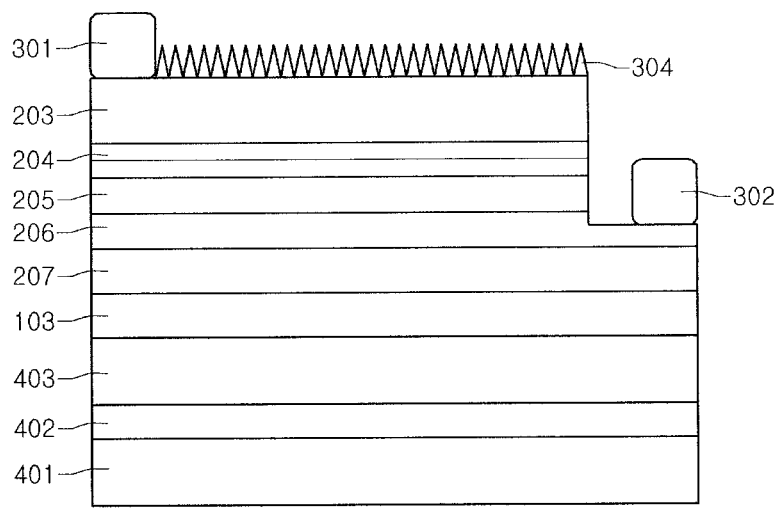
FIG. 13 is a sectional view showing the structure of a light emitting device according to the sixth embodiment.

FIG. 13 is a sectional view showing the structure of a light emitting device according to the sixth embodiment.

The light emitting device according to the sixth embodiment is similar to the light emitting device according to the fifth embodiment. Thus, details of the elements or structures that have been described in the fifth embodiment will be omitted in order to avoid redundancy.

Referring to FIG. 13, the light emitting device according to the sixth embodiment includes a light extracting structure layer 304 formed on the first conductive semiconductor layer 203.

The light extracting structure layer 304 has a concavo-convex structure on the first conductive semiconductor layer 203 in order to allow the light generated from the active layer 204 to be effectively emitted to the outside. The light extracting structure layer 304 can be formed by selectively etching the first conductive semiconductor layer 203. Otherwise, an additional material is formed on the first conductive semiconductor layer 203 and then the first conductive semiconductor layer 203 is etched to form the light extracting structure layer 304.

The light emitted from the active layer 204 can be easily extracted through the first conductive semiconductor layer 203 by the light extraction structure layer 304, so that the light efficiency of the light emitting device can be improved.

Figure 14:
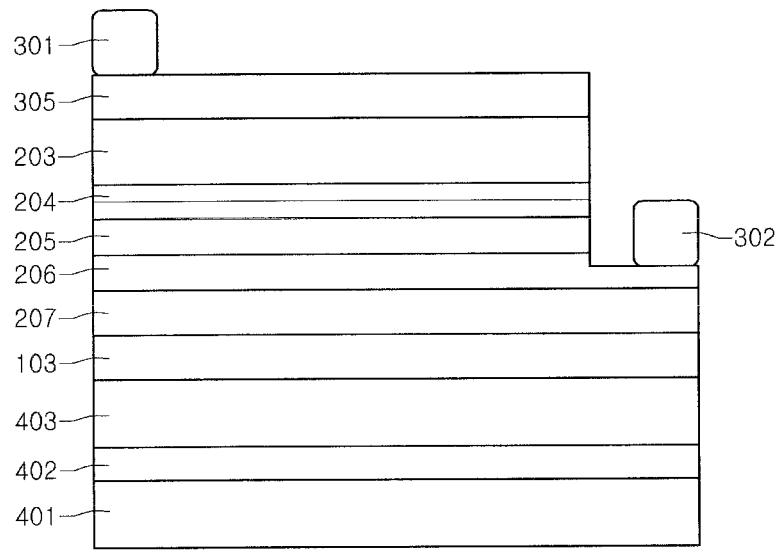
FIG. 14 is a sectional view showing the structure of a light emitting device according to the seventh embodiment.

FIG. 14 is a sectional view showing the structure of a light emitting device according to the seventh embodiment.

The light emitting device according to the seventh embodiment is similar to the light emitting device according to the fifth embodiment Thus, details of the elements or structures that have been described in the fifth embodiment will be omitted in order to avoid redundancy.

Referring to FIG. 14, an ohmic contact electrode layer 305 is formed on the first conductive semiconductor layer 203, and the first electrode layer 301 is formed on the ohmic contact electrode layer 305.

The ohmic contact electrode layer 305 forms an ohmic contact interface with respect to the first conductive semiconductor layer 203 and includes a material having transmittance of about 70% or above with respect to the light having the wavelength of about 600 nm or below.

For instance, the ohmic contact electrode layer 305 includes at least one selected from the group consisting of TiN, TiO, ITO, ZnO, $RuO_2$, $IrO_2$, $In_2O_3$, $SnO_2$, ZnGaO, InZnO, ZnInO, and Ni—O—Au.

The current can be effectively injected into the active layer 204 due to the ohmic contact electrode layer 305, so that the electric characteristics of the light emitting device can be improved.

Figure 15:
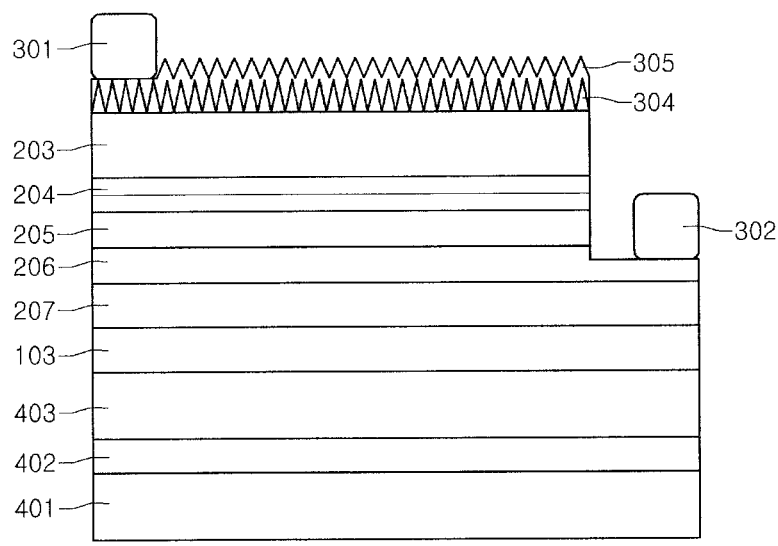
FIG. 15 is a sectional view showing the structure of a light emitting device according to the eighth embodiment.

FIG. 15 is a sectional view showing the structure of a light emitting device according to the eighth embodiment.

The light emitting device according to the eighth embodiment is similar to the light emitting device according to the fifth embodiment. Thus, details of the elements or structures that have been described in the fifth embodiment will be omitted in order to avoid redundancy.

Referring to FIG. 15, the light emitting device according to the eighth embodiment includes a light extracting structure layer 304 formed on the first conductive semiconductor layer 203 and an ohmic contact electrode layer 305 formed on the light extracting structure layer 304. In addition, the first electrode 301 is formed on the ohmic contact electrode layer 305.

The light extracting structure layer 304 has a concavo-convex structure on the first conductive semiconductor layer 203 in order to allow the light generated from the active layer 204 to be effectively emitted to the outside. The light extracting structure layer 304 can be formed by selectively etching the first conductive semiconductor layer 203. Otherwise, an additional material is formed on the first conductive semiconductor layer 203 and then the first conductive semiconductor layer 203 is etched to form the light extracting structure layer 304.

The light emitted from the active layer 204 can be easily extracted through the first conductive semiconductor layer 203 by the light extraction structure layer 304, so that the light efficiency of the light emitting device can be improved.

The ohmic contact electrode layer 305 includes a material having transmittance of about 70% or above with respect to the light having the wavelength of about 600 nm or below.

For instance, the ohmic contact electrode layer 305 includes at least one selected from the group consisting of TiN, TiO, ITO, ZnO, RuO$_2$, IrO$_2$, In$_2$O$_3$, SnO$_2$, ZnGaO, InZnO, ZnInO, and Ni—O—Au.

The current can be effectively injected into the active layer 204 due to the ohmic contact electrode layer 305, so that the electric characteristics of the light emitting device can be improved.

FIGS. 16 to 21 are sectional views showing the procedure for manufacturing the light emitting device according to the fifth embodiment.

Figure 16:
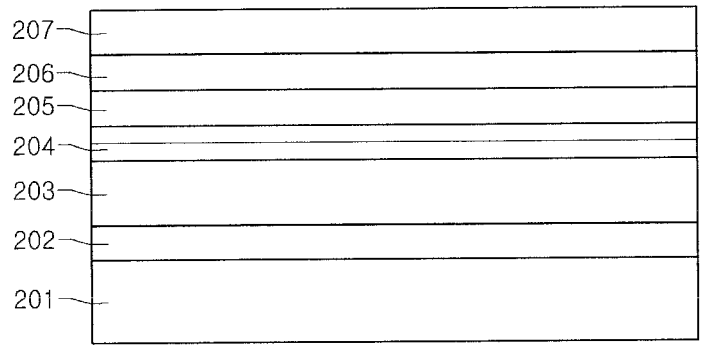
FIGS. 16 to 21 are sectional views showing the procedure for manufacturing a light emitting device according to the fifth embodiment.

Referring to FIG. 16, a buffer layer 202 is formed on a growth substrate 201, a light emitting semiconductor layer including the first conductive semiconductor layer 203, the active layer 204 and the second conductive semiconductor layer 205 is formed on the buffer layer 202, and the current spreading layer 206 and the second wafer bonding layer 207 are formed on the second conductive semiconductor layer 205.

For instance, the growth substrate 201 may include Al$_2$O$_3$, SiC, Si, AlN, GaN, AlGaN, glass, or GaAs.

The buffer layer 202 is formed on the growth substrate 201 for the lattice match and includes at least one selected from the group consisting of InGaN, AlN, SiC, SiCN, and GaN.

The light emitting semiconductor layer can be formed on the buffer layer through the MOCVD process or the MBE process. For example, the first conductive semiconductor layer 203 may include a GaN layer or an AlGaN layer doped with Si, and the active layer 204 may include an undoped InGaN layer or an undoped GaN layer. In addition, the second conductive semiconductor layer 205 may include a GaN layer or an AlGaN layer doped with Mg.

Figure 17:
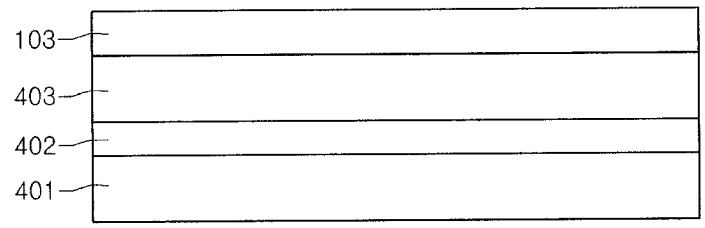

Referring to FIG. 17, the support substrate 401 is prepared and the bonding reinforcing layer 402 and the metal thick film layer 403 are formed on the support substrate 401. In addition, the first wafer bonding layer 103 is formed on the metal thick film layer 403.

The support substrate 401 may include a material having a thermal expansion coefficient identical or similar to that of the growth substrate 201. In addition, the first wafer bonding layer 103 may include a material identical to or different from a material of the second wafer bonding layer 207.

Figure 18:
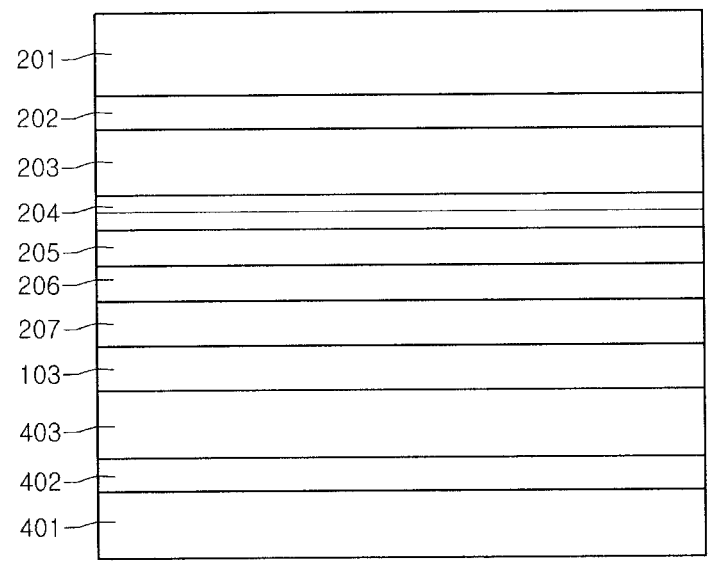

Referring to FIG. 18, the structure shown in FIG. 16 is combined with the structure shown in FIG. 17 through the bonding process, thereby forming a complex structure.

The wafer bonding process can be performed under the vacuum, oxygen, argon or nitrogen atmosphere at the temperature range from the normal temperature to 700° C. or below while applying predetermined hydrostatic pressure. At this time, the interface property between the second conductive semiconductor layer 205 and the current spreading layer 206 must not be degraded.

Figure 19:
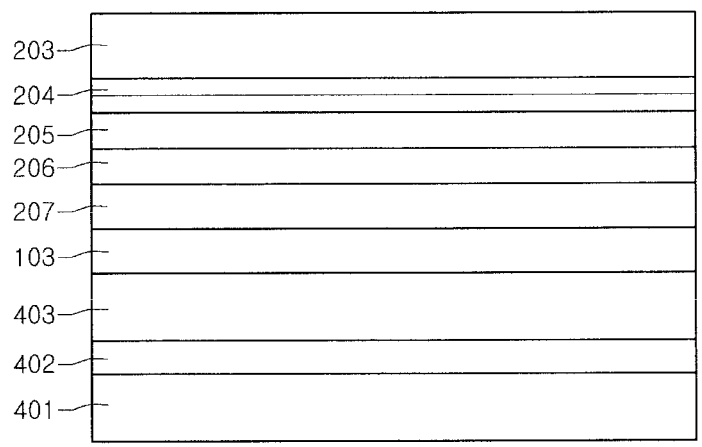

Referring to FIG. 19, the growth substrate 201 is separated from the complex structure shown in FIG. 18. The growth substrate 201 can be separated from the complex structure through the thermo-chemical decomposing reaction or the chemical etching reaction.

For instance, if a transparent substrate subject to the thermo-chemical decomposition reaction, such as a sapphire substrate or an AlN substrate, is used for the growth substrate 201, the growth substrate 201 can be separated from the complex structure by irradiating photon beams onto the growth substrate 201.

At this time, the buffer layer 202 is also removed from the first conductive semiconductor layer 203.

Figure 20:
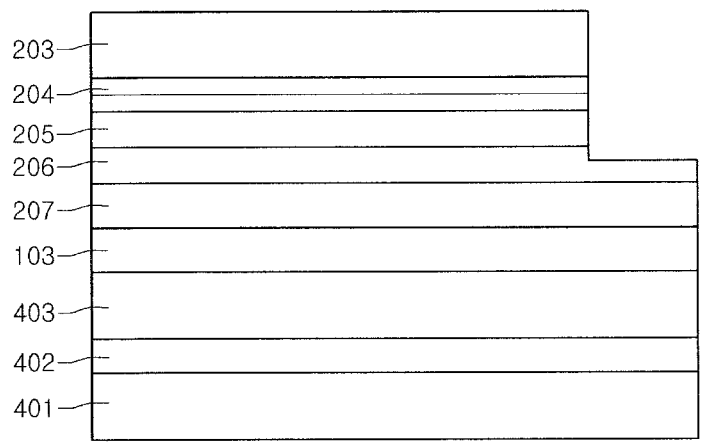

Referring to FIG. 20, the first conductive semiconductor layer 203, the active layer 204, the second conductive semiconductor layer 205, and the current spreading layer 206 are selectively removed through the dry etching or the wet etching process in such a manner that the current spreading layer 206 is partially exposed to the outside. When the wet etching process is performed, a base such as KOH, a salt or an acid solution can be employed.

Figure 21:
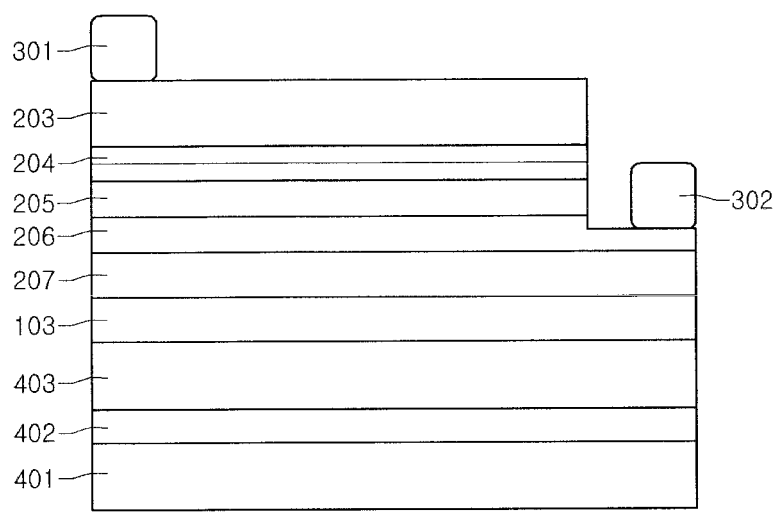

Referring to FIG. 21, the first electrode layer 301 is formed on the first conductive semiconductor layer 203 and the second electrode layer 302 is formed on the current spreading layer 206.

The light emitting device according to the fifth embodiment can be manufactured through the above procedure.

Meanwhile, the method of manufacturing the light emitting device according to the sixth embodiment is similar to that of the fifth embodiment.

According to the sixth embodiment, after the process shown in FIG. 20 has been performed, the light extracting structure 304 is formed by dry etching or wet etching the first conductive semiconductor layer 203 before the first electrode layer 301 is formed.

In addition, the method of manufacturing the light emitting device according to the seventh embodiment is similar to that of the fifth embodiment.

According to the seventh embodiment, after the process shown in FIG. 20 has been performed, the ohmic contact electrode layer 305 is formed on the first conductive semiconductor layer 203 before the first electrode layer 301 is formed.

Further, the method of manufacturing the light emitting device according to the eighth embodiment is similar to that of the fifth embodiment.

According to the eighth embodiment, after the process shown in FIG. 20 has been performed, the light extracting structure 304 is formed by dry etching or wet etching the first conductive semiconductor layer 203 and the ohmic contact electrode layer 305 is formed on the light extracting structure 304 before the first electrode layer 301 is formed.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Industrial Applicability

The embodiments are applicable to a light emitting device used as a light source.

The invention claimed is:

1. A light emitting device comprising:
a support substrate;
a planar layer over the support substrate;
a current spreading layer over the planar layer;
a bonding layer configured to bond to the planar layer and to bond to the current spreading layer, the bonding layer being between the planar layer and the current spreading layer;
a second conductive semiconductor layer over the current spreading layer;
an active layer over the second conductive semiconductor layer;
a first conductive semiconductor layer over the active layer;
a first electrode layer over the first conductive semiconductor layer;

a second electrode layer over the current spreading layer; and a concavo-convex structure at a region where the support substrate and the planar layer contact each other, wherein at least one of the planar layer and the bonding layer includes a transparent material.

2. The light emitting device of claim 1, further comprising a reflective layer under the support substrate.

3. The light emitting device of claim 1, further comprising a light extracting structure layer over the first conductive semiconductor layer.

4. The light emitting device of claim 1, further comprising a superlattice structure layer between the second conductive semiconductor layer and the current spreading layer.

5. The light emitting device of claim 1, wherein the support substrate is formed on a top surface thereof with the concavo-convex structure.

6. The light emitting device of claim 1, wherein the bonding layer includes one of $SiO_2$, $SiN_x$, $Al_2O_3$, ZnO, ZnS, $MgF_2$, and SOG (spin on glass).

7. The light emitting device of claim 1, wherein the current spreading layer includes one of Ni—Au—O, ITO, and ZnO.

8. The light emitting device of claim 1, wherein the second electrode directly contacts the current spreading layer.

9. The light emitting device of claim 1, further comprising an ohmic contact layer between the first conductive semiconductor layer and the first electrode layer.

10. The light emitting device of claim 9, further comprising a light extracting structure layer between the first conductive semiconductor layer and the ohmic contact layer, the light extracting structure layer having a second concavo-convex structure.

11. The light emitting device of claim 10, wherein the ohmic contact layer comprises a third concavo-convex structure on the light extracting structure layer.

12. The light emitting diode of claim 9, wherein the first electrode layer is directly disposed on the ohmic contact layer.

* * * * *